United States Patent
Fu et al.

(10) Patent No.: US 8,786,094 B2
(45) Date of Patent: Jul. 22, 2014

(54) SEMICONDUCTOR DEVICES AND METHODS OF MANUFACTURE THEREOF

(75) Inventors: Chung-Min Fu, Chungli (TW);
Wen-Hao Chen, Hsin-Chu (TW);
Dian-Hau Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/540,464

(22) Filed: Jul. 2, 2012

(65) Prior Publication Data

US 2014/0001638 A1    Jan. 2, 2014

(51) Int. Cl.
*H01L 23/50* (2006.01)
*H01L 21/768* (2006.01)
*H01L 23/538* (2006.01)

(52) U.S. Cl.
CPC ............ *H01L 21/768* (2013.01); *H01L 23/538* (2013.01); *H01L 2924/01079* (2013.01)
USPC .... 257/773; 257/774; 257/775; 257/E23.079; 257/E21.215; 438/618; 438/666

(58) Field of Classification Search
CPC ... H01L 21/306; H01L 23/50; H01L 2924/14; H01L 21/768; H01L 23/538; H01L 23/481; H01L 2924/01078; H01L 2924/01079; H01L 2924/01013

USPC .......... 257/773, 774, 775, E23.079, E21.215; 438/618, 666, 669

See application file for complete search history.

(56) References Cited

U.S. PATENT DOCUMENTS

| | | | | |
|---|---|---|---|---|
| 6,225,207 B1 * | 5/2001 | Parikh | ............................ | 438/622 |
| 6,337,270 B2 * | 1/2002 | Umemoto | ...................... | 438/637 |
| 6,891,261 B2 * | 5/2005 | Awaya | ............................ | 257/692 |
| 7,030,022 B2 * | 4/2006 | Jung et al. | ...................... | 438/696 |
| 2003/0001266 A1 * | 1/2003 | Hu | .................................. | 257/758 |
| 2004/0048476 A1 * | 3/2004 | Jung et al. | ...................... | 438/689 |

* cited by examiner

*Primary Examiner* — Thinh T Nguyen
(74) *Attorney, Agent, or Firm* — Slater and Matsil, L.L.P.

(57) ABSTRACT

Semiconductor devices and methods of manufacture thereof are disclosed. In one embodiment, a semiconductor device includes a workpiece and a plurality of first conductive lines disposed over the workpiece in a metallization layer. A plurality of second conductive lines is disposed over the workpiece in the metallization layer. The plurality of second conductive lines comprises a greater vertical height in a cross-sectional view of the workpiece than a vertical height of the plurality of first conductive lines.

20 Claims, 11 Drawing Sheets

SEMICONDUCTOR DEVICES AND METHODS OF MANUFACTURE THEREOF

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the sizes of conductive lines are decreased, electromigration or high resistance can become a problem, which increases the resistance of conductive lines and can lead to device failures.

What are needed in the art are improved methods of fabricating conductive lines of semiconductor devices.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to design and manufacturing methods for conductive features of semiconductor devices. Novel methods of designing and manufacturing conductive features of semiconductor devices will be described herein.

Figure 1:
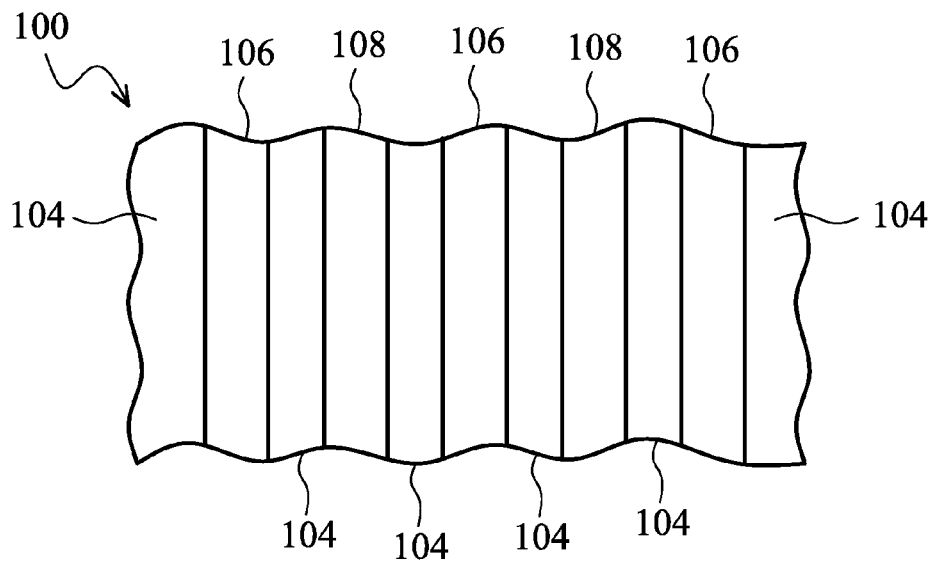
FIG. 1 is a top view of a semiconductor device in accordance with an embodiment of the present disclosure.
Figure 2:
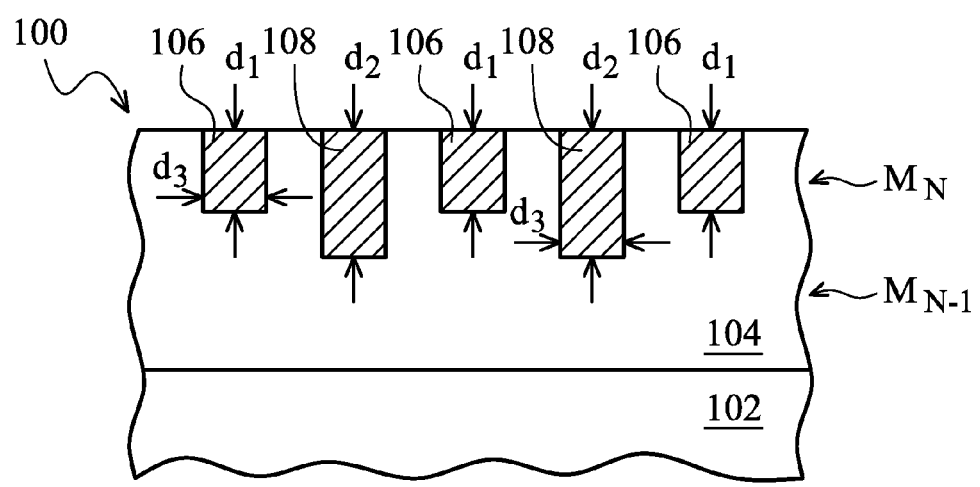
FIG. 2 is a cross-sectional view of the semiconductor device shown in FIG. 1.

FIG. 1 is a top view of a semiconductor device 100 in accordance with an embodiment of the present disclosure. FIG. 2 is a cross-sectional view of the semiconductor device 100 shown in FIG. 1. The semiconductor device 100 includes a workpiece 102. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

An insulating material 104 is formed over the workpiece 102. The insulating material 104 may comprise silicon dioxide, silicon nitride, other types of insulating materials, or combinations and/or multiple layers thereof. The insulating material 104 may include optional liners, barrier layers, and/or etch stop layers in some embodiments, not shown.

Figure 18:
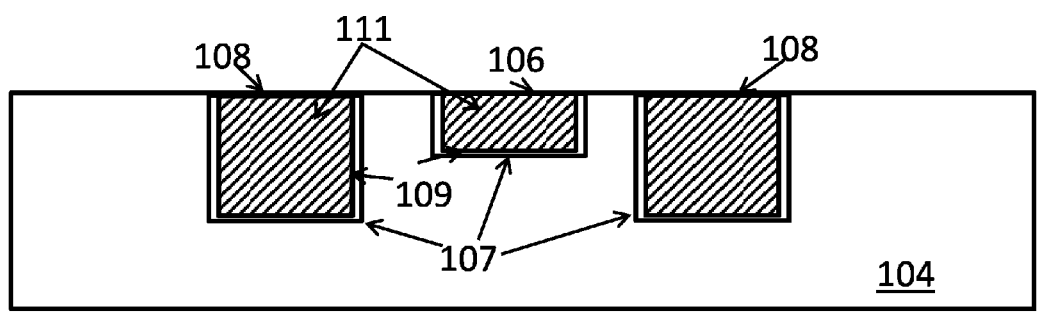
FIG. 18 illustrates a conductive line showing details of barrier layers and seed layers.

A plurality of first conductive lines 106 and a plurality of second conductive lines 108 are disposed over the workpiece 102 in a metallization layer MN within in the insulating material 104, as shown. The first conductive lines 106 and the second conductive lines 108 may comprise copper, aluminum, gold, other metals, or combinations and/or multiple layers thereof. The first conductive lines 106 and the second conductive lines 108 may optionally include barrier layers, liners, and/or seed layers in some embodiments, not shown. The first conductive lines 106 and the second conductive lines 108 may be formed using one or more damascene processes, subtractive etch processes, or a combination thereof, to be described further herein. The first conductive lines 106 and the second conductive lines 108 are formed using a single damascene process while leveraging multiple lithography and/or etch steps, in an embodiment, as an example. FIG. 18 illustrates exemplary conductive line including barrier layers 107 and seed layers 109 in addition to the conductive layer 111 that fills the trench.

In accordance with embodiments, the dimensions of the conductive lines 106 and 108 are optimized to achieve a resistance reduction for the interconnect structure of the semiconductor device 100 using a multiple patterning process. The size of the conductive lines 106 and 108 are co-optimized to achieve a proactive solution for interconnect dimensions in an initial design stage in accordance with embodiments, to ensure an improved interconnect design. In the embodiment shown in FIGS. 1 and 2, the second conductive lines 108 have a greater vertical height or thickness comprising dimension $d_2$ in a cross-sectional view of the workpiece 102 than a vertical height or thickness comprising dimension $d_1$ of the plurality of first conductive lines 106. In the horizontal direction in the cross-sectional view, the first conductive lines 106 and the second conductive lines 108 have a width comprising dimension $d_3$ that is substantially the same. Dimensions $d_1$, $d_2$, and $d_3$ may comprise about 100 µm or less, as examples, although alternatively, dimensions $d_1$, $d_2$, and $d_3$ may comprise other values. Dimension $d_2$ may comprise about 1.5 to 3 times greater than dimension $d_1$ in some embodiments, as an example. Alternatively, dimensions $d_1$ and $d_2$ may have other relative values.

In an initial design of the semiconductor device 100, dimension $d_2$ of the second conductive lines 108 is the same as dimension $d_1$. However, if the resistance or electromigration property of the second conductive lines 108 is determined to potentially be a problem for a signal or other use that the second conductive lines 108 is planned for, the height or thickness comprising dimension $d_2$ of the second conductive lines 108 is increased, in accordance with embodiments of the present disclosure. Increasing the thickness of the second conductive lines advantageously 108 results in lowering a resistance of the second conductive lines 108 and/or improving an electromigration property of the second conductive lines 108. The increase of the thickness of the second conductive lines 108 is achieved by lengthening an etch process of the insulating material 104, by adding an etch process of the insulating material 104, or by adding an additional amount of material to the plurality of second conductive lines 108, in accordance with embodiments. Two or more lithography masks may be used to pattern the first and second conductive lines 106 and 108 having the different heights $d_1$ and $d_2$ in accordance with embodiments, to be described further herein.

In some embodiments, the conductive lines 106 and 108 are alternating; e.g., one of the second conductive lines 108 is disposed between two of the first conductive lines 106 in the embodiment shown in FIGS. 1 and 2. In other embodiments, the first conductive lines 106 and the second conductive lines 108 may comprise other relative locations. As an example, in FIG. 12, the second conductive lines 108 are placed at edges of a semiconductor device 100 or at edges of a region of the semiconductor device 100, and the first conductive lines 106 are placed in central regions between the second conductive lines 108. Alternatively, the second conductive lines 108 may be placed in central regions and the first conductive lines 106 may be placed at edge regions, not shown in the drawings.

The first conductive lines 106 and the second conductive lines 108 may comprise conductive lines for different types of signals and/or purposes, in some embodiments. As one example, the second conductive lines 108 may comprise power rail conductive lines such as Vss and Vdd conductive lines, and the first conductive lines 106 may comprise standard cell conductive lines. The standard cell conductive lines 106 may comprise conductive lines for complementary metal oxide semiconductor (CMOS) devices, such as p-channel MOS (PMOS) devices and/or n-channel MOS (NMOS) devices, for example. Alternatively, the conductive lines 106 and 108 may comprise conductive lines for other signals and applications, and the first conductive lines 106 and the second conductive lines 108 may comprise conductive lines for the same or similar types of signals and/or purposes, in other embodiments.

In some embodiments, the second conductive lines 108 are formed in the same metallization layer $M_N$ that the first conductive lines 106 are formed in. The first conductive lines 106 are formed partially in the metallization layer $M_N$, and the second conductive lines 108 may be formed in the metallization layer $M_N$, extending through the full thickness of the metallization layer $M_N$. The second conductive lines 108 may also extend partially through the metallization layer $M_N$, yet may extend a greater amount into the metallization layer $M_N$ than the first conductive lines 106 extend, as another example. In other embodiments, the first conductive lines 106 extend partially or completely through metallization layer $M_N$, and the second conductive lines 108 extend completely through the metallization layer $M_N$ and also extend at least partially into a metallization layer $M_{N-1}$ that is adjacent to metallization layer $M_N$. The adjacent metallization layer $M_{N-1}$ may comprise a via layer of the semiconductor device 100 that optionally includes a plurality of vias formed therein, for example. The adjacent metallization layer $M_{N-1}$ may alternatively comprise other types of conductive layers, such as conductive line layers or contact layers of the semiconductor device 100, as examples. The metallization layer $M_N$ may comprise a first metallization layer, and the metallization layer $M_{N-1}$ may comprise a second metallization layer, wherein a portion of the plurality of second conductive lines 108 is disposed in the second metallization layer $M_{N-1}$ adjacent the first metallization layer $M_N$ in some embodiments, for example.

Figure 3:
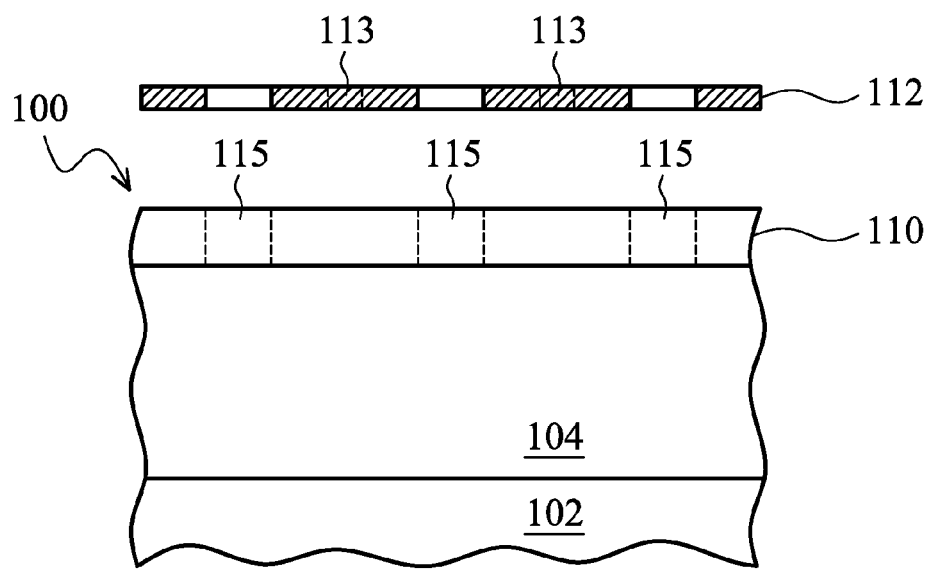
FIGS. 3 through 9 are cross-sectional views of a semiconductor device illustrating a method of manufacturing the semiconductor device shown in FIG. 2 at various stages in accordance with an embodiment.

FIGS. 3 through 9 are cross-sectional views illustrating a method of manufacturing the semiconductor device 100 shown in FIG. 2 at various stages in accordance with an embodiment. The first and second conductive lines 106 and 108 are formed using a damascene method in accordance with this embodiment. To manufacture the semiconductor device 100, the workpiece 102 is provided, and the insulating material 104 is formed over the workpiece 102, as shown in FIG. 3. A layer of photoresist 110 comprising a first layer of photoresist is deposited over the insulating material 104. A first lithography mask 112 is provided. The first lithography mask 112 has a pattern for the plurality of first conductive lines 106 formed thereon. The first lithography mask 112 may comprise a transmissive mask or a reflective mask, as examples. The first lithography mask 112 may optionally also include a pattern for the second conductive lines 108, as shown in phantom at 113, to be described further herein.

The layer of photoresist 110 is patterned using the first lithography mask 112, as shown in FIG. 3 in phantom at 115, e.g., by exposing the layer of photoresist 110 to light or energy through or reflected from the mask 112. The layer of photoresist 110 is developed, and exposed portions (or unexposed portions, depending on whether the photoresist 110 is positive or negative) of the layer of photoresist 110 are ashed and etched away, leaving the patterned layer of photoresist 110 shown in FIG. 4.

Figure 4:
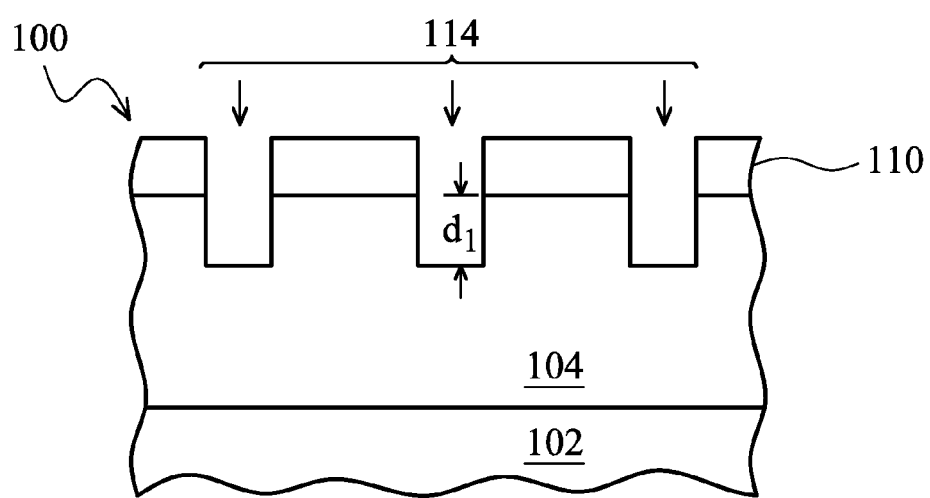
Figure 5:
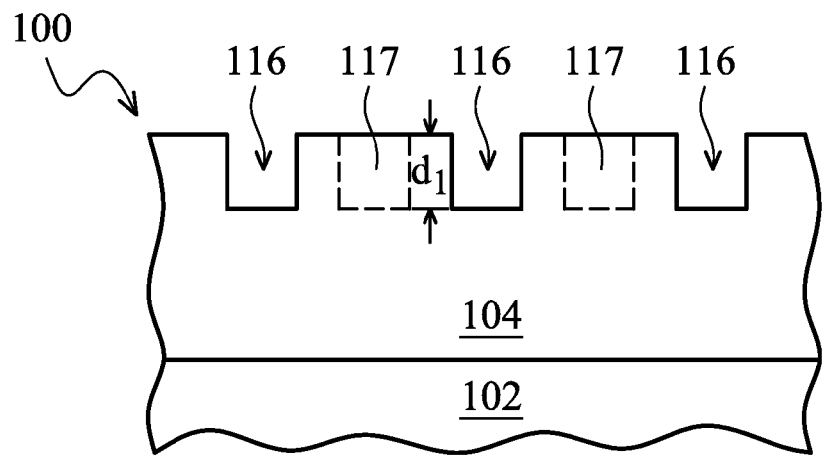

The semiconductor device 100 is exposed to a first etch process 114, as shown in FIG. 4. The layer of photoresist 110 is used as an etch mask during the first etch process 114. Exposed portions of the insulating material 104 not covered by photoresist 110 are etched away during the first etch process 114. The first etch process 114 may comprise a timed etch that is adapted to achieve a desired dimension $d_1$ of the first conductive lines 106 within the insulating material 104, for example. The type of etch process 114 used is a function of the type of material or materials of the insulating material 104, for example. The layer of photoresist 110 is then removed, as shown in FIG. 5, leaving patterns 116 in the insulating material 104 for the first conductive lines 106. Optionally, portions of patterns 117 may also be formed for the second conductive lines 108, as shown in phantom, to be described further herein.

Figure 6:
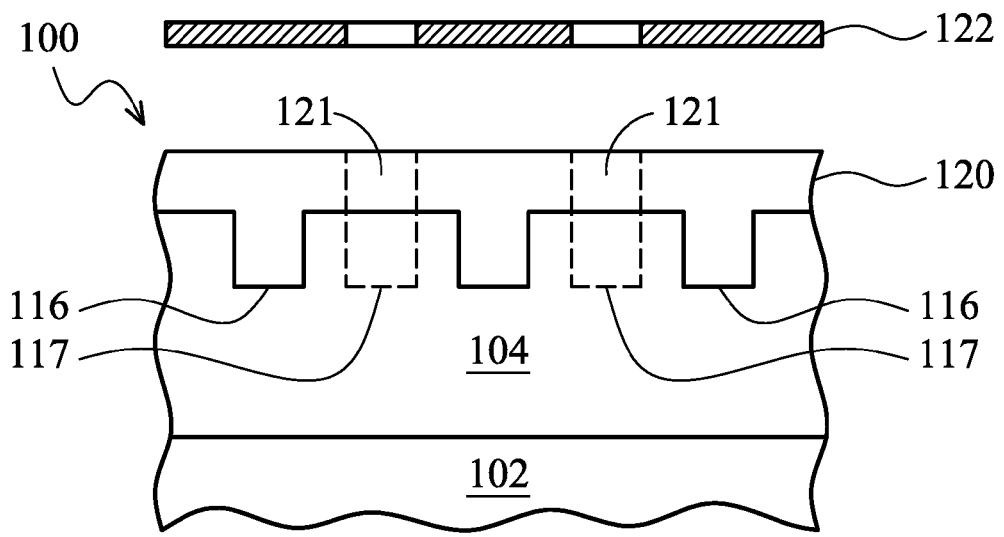

A second layer of photoresist 120 is formed over the insulating material 104, as shown in FIG. 6. The second layer of photoresist 120 fills the patterns 116 in the insulating material 104 and optionally, also portions of patterns 117. A second lithography mask 122 is provided. The second lithography mask 122 has a pattern for the plurality of second conductive lines 108 formed thereon. The second lithography mask 122 may comprise a transmissive mask or a reflective mask, as examples, similar to the first lithography mask 112.

The second layer of photoresist 120 is then patterned using the second lithography mask 122, as shown in FIG. 6 in phantom at 121, by exposing the layer of photoresist 110 to light or energy through or reflected from the mask 122. The second layer of photoresist 120 is developed, and exposed or unexposed portions of the second layer of photoresist 120 are ashed and etched away, leaving the patterned second layer of photoresist 120 shown in FIG. 7.

Figure 7:
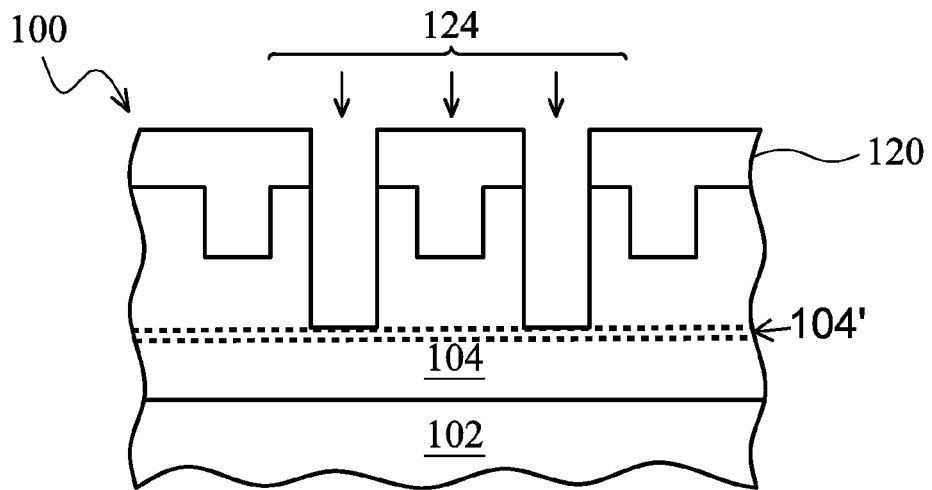

The semiconductor device 100 is exposed to a second etch process 124, as shown in FIG. 7, etching away exposed portions of the insulating material 104. The second etch process 124 may comprise a timed etch that is adapted to achieve a desired dimension $d_2$ of the second conductive lines 108, for example. The second etch process 124 may alternatively comprise an end point detector and may be adapted to stop when an etch stop layer 104', shown in phantom in FIG. 7, of the insulating material 104 has been reached, as another example. The bottom surface of the second conductive lines 108 is adjacent the top surface of the etch stop layer 104' in this embodiment, for example. The type of etch process 124 used is a function of the type of material or materials of the insulating material 104. The second etch process 124 for the second conductive lines 108 is performed for a longer period of time than the first etch process 114 for the first conductive lines 106 in some embodiments, for example. In other embodiments, the second etch process 124 may comprise an over-etch process or an additional etch process, for example.

Figure 8:
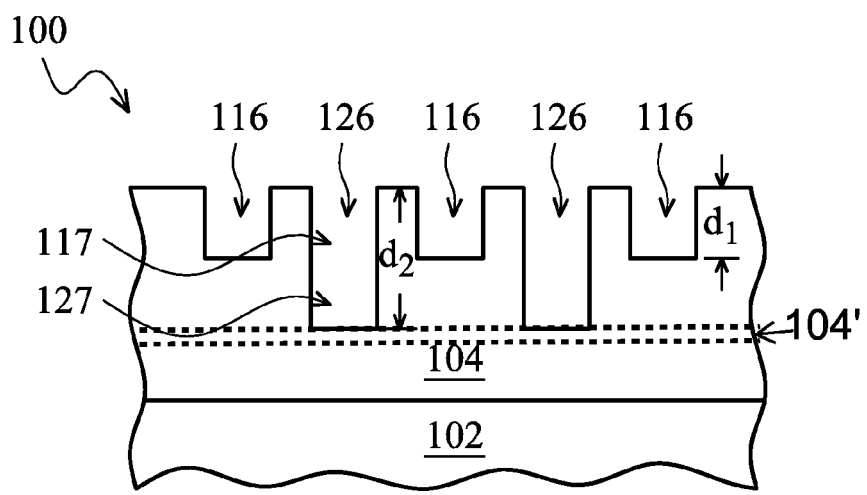
Figure 9:
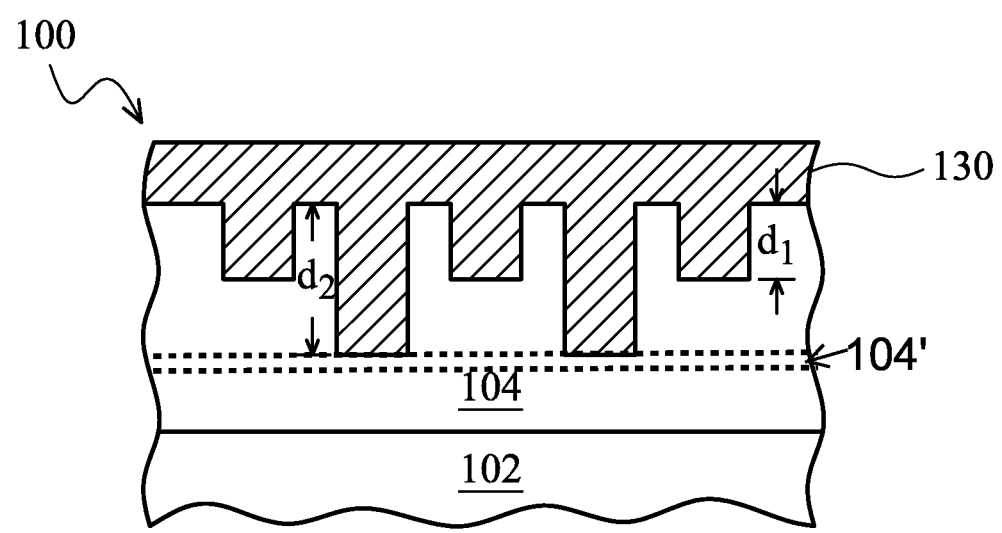

The second layer of photoresist 120 is then removed, as shown in FIG. 8, leaving patterns 126 in the insulating material 104 for the second conductive lines 108 having a depth comprising dimension $d_2$. In FIG. 9, a conductive material 130 is formed over the patterned insulating material 104. The conductive material 130 may comprise copper, aluminum, gold, other metals, or combinations and multiple layers thereof. The conductive material 130 may include barrier layers, liners, and/or seed layers in some embodiments, not shown. Excess conductive material 130 is removed from over a top surface of the insulating material 104 using a chemical mechanical polish (CMP) process and/or an etch process, leaving portions of the conductive material 130 remaining within the patterned insulating material 104, forming the plurality of the first conductive lines 106 and the plurality of second conductive lines 108 in the insulating material 104 and leaving the structure shown in FIG. 2.

In some embodiments, the first lithography mask 112 includes the pattern for the first conductive lines 106 and also includes the pattern 113 for the second conductive lines 108, as shown in phantom in FIG. 3. The first etch process 114 forms the patterns 116 for the first conductive lines 106 and also forms an upper portion 117 of the patterns 126 for the second conductive lines 108, as shown in phantom in FIG. 5. The second lithography mask 122 (see FIG. 6) includes only the patterns for the second conductive lines 108. The second etch process 124 (see FIG. 7) comprises a second etch process that forms a lower portion 127 of the patterns 126 for the second conductive lines 108, in this embodiment, leaving the structure shown in FIG. 8 that includes the patterns 116 for the first conductive lines 106 and the patterns 126 for the second conductive lines 108 that include the upper portion 117 and the lower portion 127. The patterns 126 for the second conductive lines 108 are formed using a double etch process in this embodiment, using both the first etch process 114 to form the upper portion 117 and using the second etch process 124 to form the lower portion 127 of the patterns 126. The second etch process 124 may comprise an additional etch process that is used to double-etch or over-etch the insulating material 104 and form the second conductive lines 108 having the increase thickness comprising dimension $d_2$.

Figure 10:
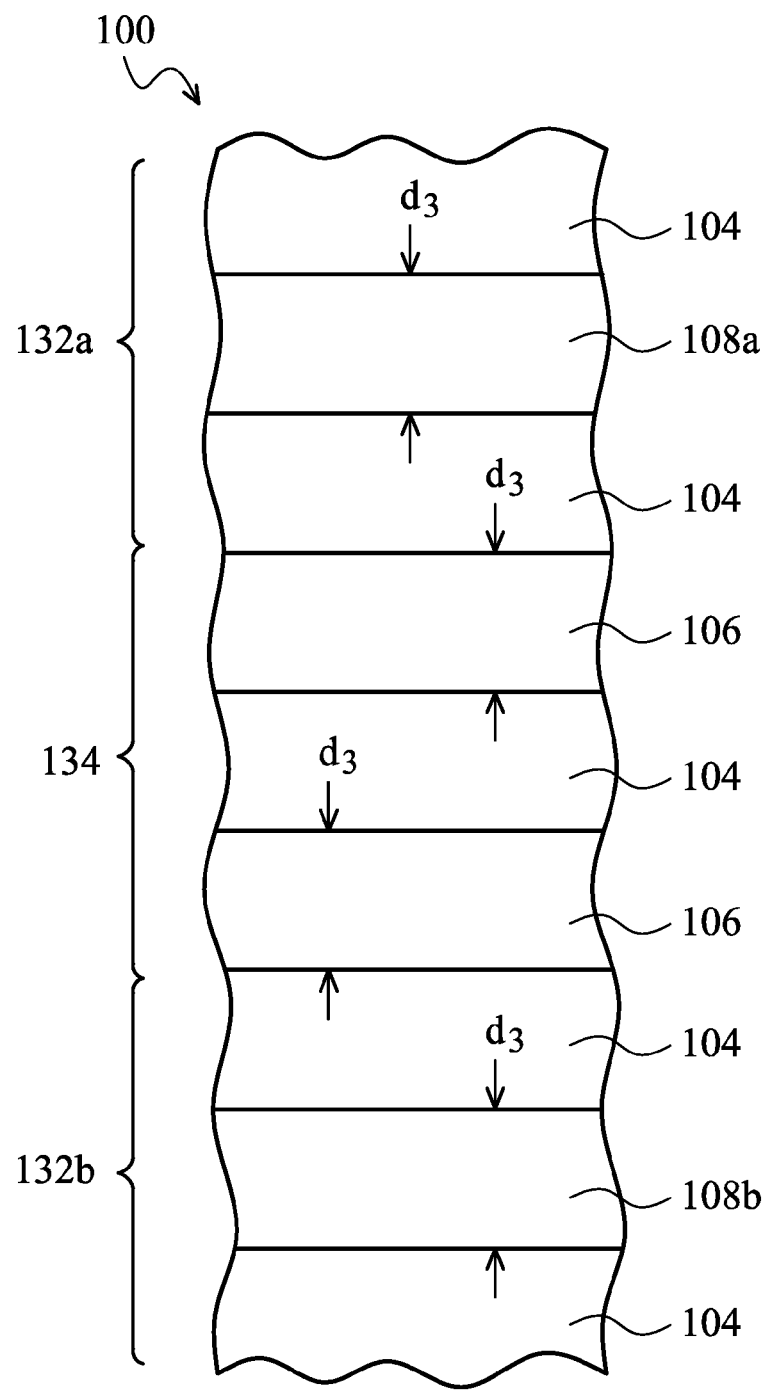
FIGS. 10 and 11 show top views of a method of designing a semiconductor device in accordance with an embodiment.
Figure 11:
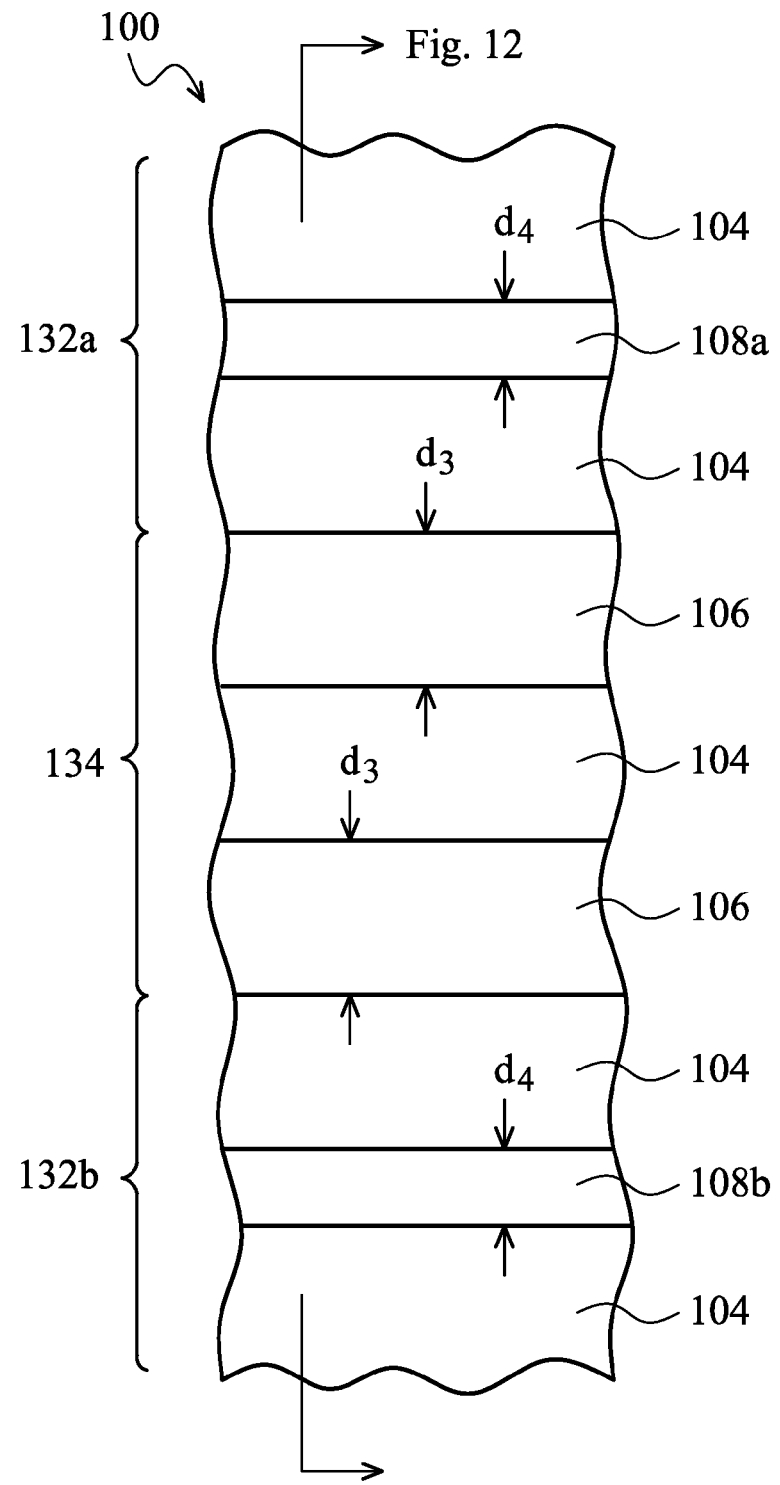

FIGS. 10 and 11 show top views of a method of designing a semiconductor device 100 in accordance with an embodiment. In FIG. 10, a top view of an initial design is shown, wherein first conductive lines 106 and second conductive lines 108 comprise substantially a same width comprising dimension $d_3$. Note that the structure shown in FIG. 10 is not manufactured; it merely illustrates an initial design for the conductive lines 106 and 108. Regions 132a and 132b comprise power rails, wherein region 132a comprises Vdd lines 108a and region 132b comprises Vss lines 108b. Region 134 comprises a standard cell region including conductive lines 106 for PMOS and NMOS devices. The Vdd lines 108a and the Vss line 108b are referred to collectively herein as second conductive lines 108.

Figure 12:
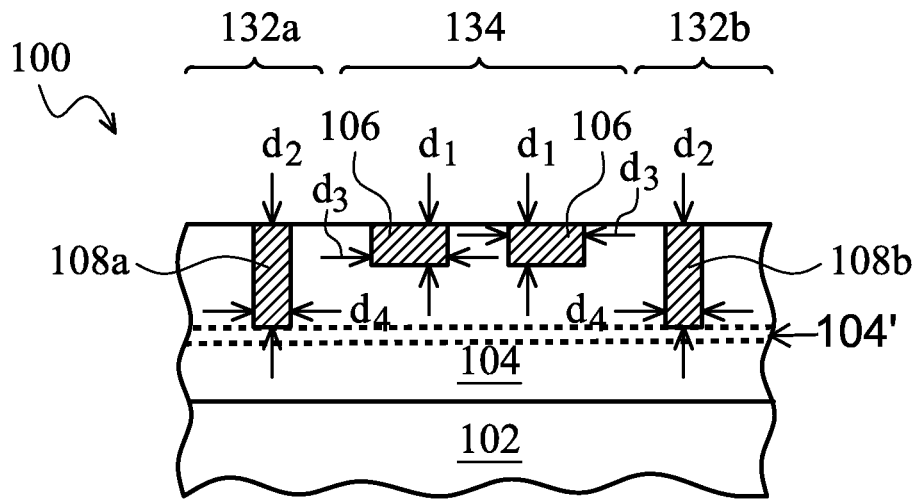
FIG. 12 shows a cross-sectional view of the semiconductor device shown in FIG. 11.

In accordance with an embodiment, a width of the second conductive lines 108 in the top view is decreased in regions 132a and 132b to comprise dimension $d_4$, as shown in FIG. 11. The plurality of second conductive lines 108 in regions 132a and 132b comprise a lesser horizontal width comprising dimension $d_4$ in the cross-sectional view of the workpiece 102 than a horizontal width comprising dimension $d_3$ of the plurality of first conductive lines 106 in region 134. The height or vertical thickness of the second conductive lines 108 is also increased to comprise dimension $d_2$, as described for the embodiment shown in FIGS. 1 through 9, and as shown in the cross-sectional view of FIG. 12. FIGS. 11 and 12 also illustrate an embodiment wherein the second conductive lines 108 are disposed at edge regions of the semiconductor device 100 or at edges of a region of the semiconductor device 100, and the first conductive lines 106 are disposed at central regions of the semiconductor device 100 or at a center of a region of the semiconductor device 100.

Regions 132a and 132b including the power rails (e.g., second conductive lines 108) have a thicker metal thickness, with lower resistance and higher electromigration immunity than the first conductive lines 106 in the standard cell region 134, for example.

In the embodiment shown in FIGS. 11 and 12, dimensions $d_2$ and $d_4$ may be optimized to achieve substantially the same amount of conductive material 130 for the second conductive lines 108 in the cross-sectional view as dimensions $d_1$ and $d_3$ of the first conductive lines 106. In the design process, the area of dimensions ($d_2 \times d_4$) can be selected to be substantially equal to the area of dimensions ($d_1 \times d_3$) in some embodiments, for example, so that the resistance of the first conductive lines 106 and the second conductive lines 108 is substantially the same. As one example, if dimensions $d_1$ and $d_3$ both comprise 100 μm, dimension $d_2$ may be selected to be 200 μm, which is twice dimension $d_1$, and dimension $d_4$ may be selected to be 50 μm, which is half dimension $d_3$, so that the cross-sectional area of ($d_1 \times d_3$) and also ($d_2 \times d_4$) are both equal to 1,000 μm. Alternatively, dimensions $d_2$ and $d_4$ may comprise other values relative to dimensions $d_1$ and $d_3$ so that the first conductive lines 106 and the second conductive lines 108 comprise different resistance values.

In some embodiments, decreasing the width of the plurality of second conductive lines 108 comprises decreasing the width of the plurality of second conductive lines by about one-third to one-half, for example. Alternatively, the width of the plurality of second conductive lines 108 may comprise decreasing the width by other amounts or values.

By decreasing the width comprising dimension $d_4$ of the second conductive lines 108, more of the conductive lines 106 and 108 may be placed in a given amount of area over the workpiece 102, advantageously saving space on the semiconductor device 100 and allowing for a more compact, dense layout in some embodiments.

Figure 13:
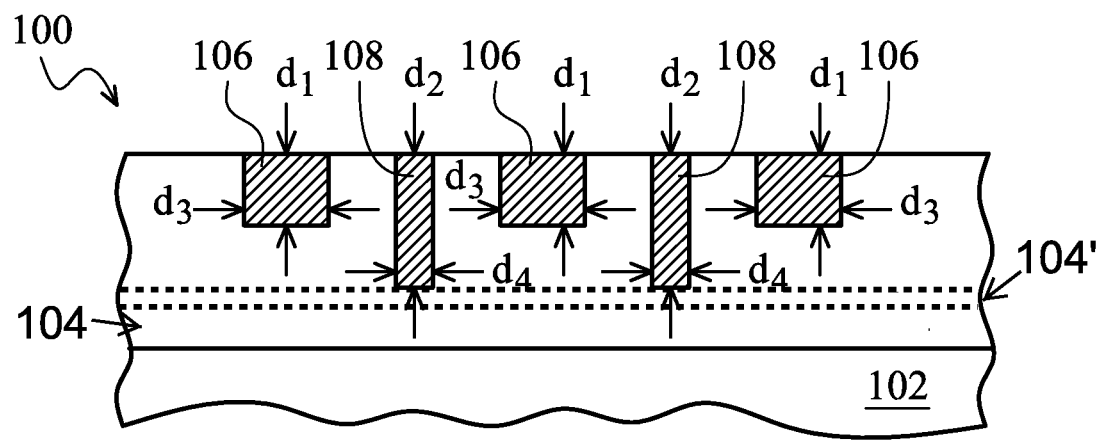
FIG. 13 shows a cross-sectional view of a semiconductor device in accordance with another embodiment.

FIG. 13 shows a cross-sectional view of a semiconductor device 100 in accordance with another embodiment. The dimensions $d_2$ and $d_4$ of the second conductive lines 108 are different than dimensions $d_1$ and $d_3$ of the first conductive lines 106, as described for the embodiment shown in FIGS. 11 and 12. However, the first and second conductive lines 106 and 108 are positioned in an alternating arrangement as in the first embodiment shown in FIGS. 1 through 9, wherein one of the second conductive lines 108 is disposed between two of the first conductive lines 106.

Figure 14:
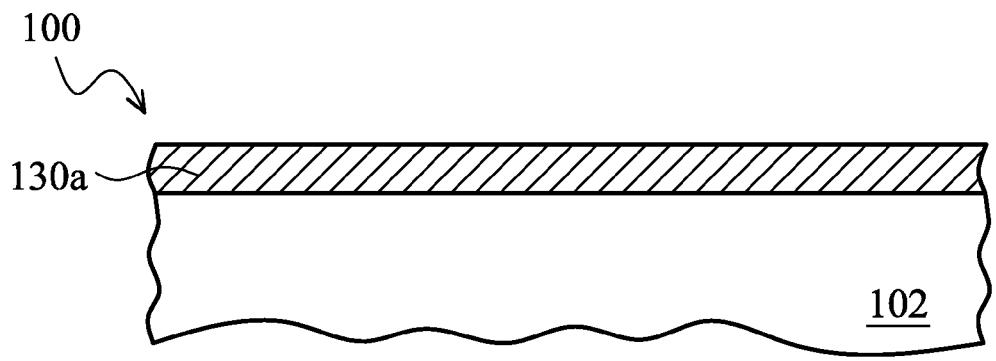
FIGS. 14 through 16 show cross-sectional views of a method of manufacturing a semiconductor device at various stages in accordance with another embodiment.
Figure 15:
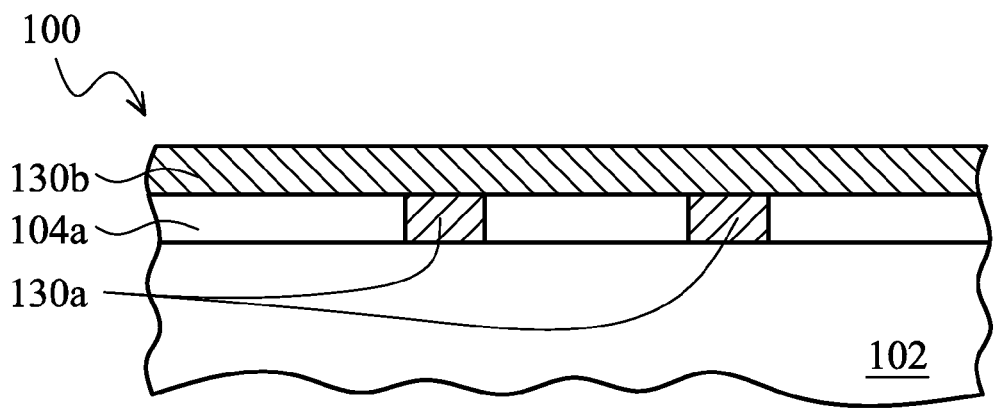
Figure 16:
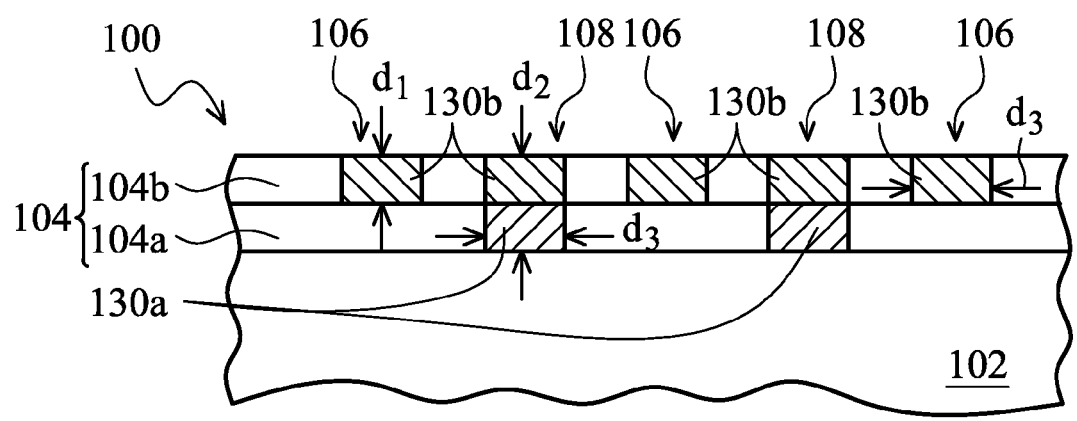

FIGS. 14 through 16 show cross-sectional views of a method of manufacturing a semiconductor device in accordance with another embodiment, wherein a subtractive etch process is used to fabricate the first and second conductive lines 106 and 108. The workpiece 102 is provided, and a first conductive material 130a is formed over the workpiece 102. The first conductive material 130a is patterned using a first layer of photoresist and a first lithography mask (not shown in FIGS. 14 and 15; see the first layer of photoresist 110 and the first lithography mask 112 shown in FIG. 3), forming lower portions of the second conductive lines 108 comprising the first conductive material 130a. A first portion of the insulating material 104a is disposed between the patterned first conductive material 130a. The first portion of the insulating material 104a may be spun-on, or the first portion of the insulating material 104a may be deposited over the first conductive material 130a, with excess portions of the first portion of the insulating material 104a being later removed from over top surfaces of the patterned first conductive material 130a, for example. The first portion of the insulating material 104a may alternatively be formed using other methods.

A second conductive material 130b is then deposited over the first conductive material 130a and the first portion of the insulating material 104a, as shown in FIG. 15. The second conductive material 130b is patterned using a second layer of photoresist and a second lithography mask (not shown in FIGS. 15 and 16; see the second layer of photoresist 120 and the second lithography mask 122 shown in FIG. 6), forming the first conductive lines 106 and upper portions of the second conductive lines 108 that comprise the second conductive material 130b. A second portion of the insulating material 104b is then disposed between the patterned second conductive material 130b, using a similar method described for the first portion of the insulating material 104a.

FIG. 16 shows the first conductive lines 106 comprising the patterned second conductive material 130b and the second conductive lines 108 comprising the patterned first and second conductive materials 130a and 130b within the insulating material 104 comprising the portions of the insulating material 104a and 104b. Advantageously, the second conductive lines 108 comprise a greater height or thickness comprising dimension $d_2$ than the height or thickness comprising dimension $d_1$ of the first conductive lines 106, as described for the previous embodiments herein. The second conductive lines 108 may also be manufactured so that the width $d_3$ comprises dimension $d_4$, as described for the embodiments shown in FIGS. 11 through 13, not shown in the drawings.

Figure 17:
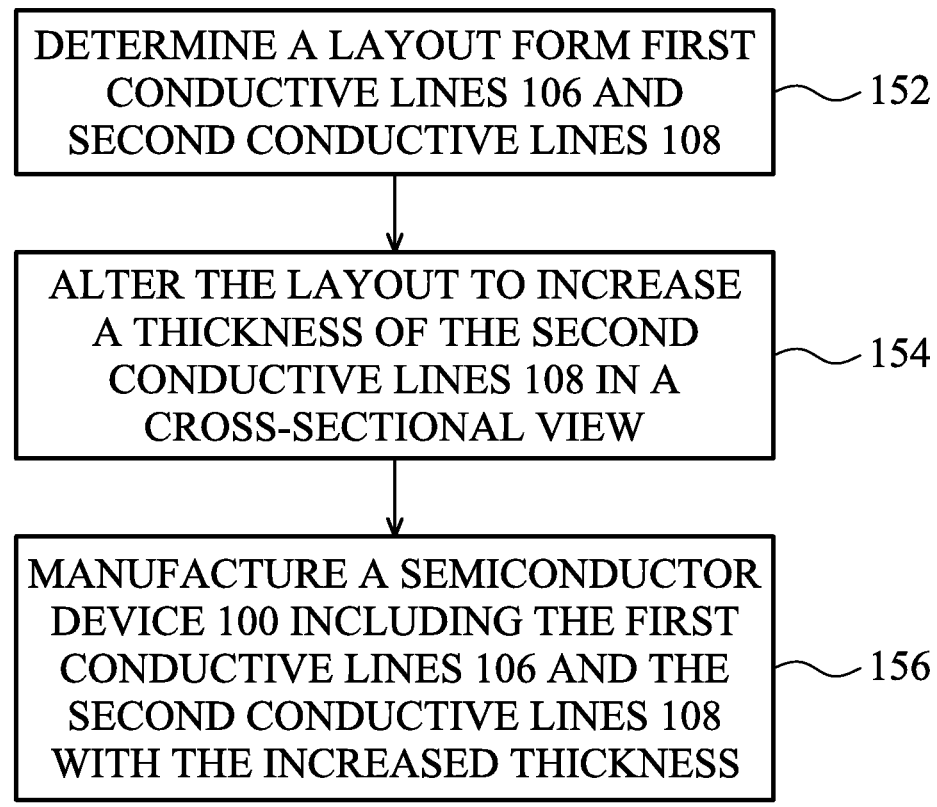
FIG. 17 is a flow chart illustrating a method of designing a semiconductor device in accordance with an embodiment of the present disclosure.

FIG. 17 is a flow chart 150 illustrating a method of designing a semiconductor device 100 in accordance with an embodiment of the present disclosure. The design method includes first determining a layout for a plurality of first conductive lines 106 and a plurality of second conductive lines 108 of the semiconductor device 100, as shown in step 152. In step 154, the layout is altered to increase a thickness of the plurality of second conductive lines 108 in a cross-sectional view of the semiconductor device 100. In step 156, a semiconductor device 100 is then manufactured that includes the plurality of first conductive lines 106 and the plurality of second conductive lines 108 with the increased thickness. Altering the layout may further include decreasing a width of the plurality of second conductive lines 108 in a top view of the semiconductor device 100.

The amount to alter the layout to increase the thickness of the second conductive lines 108 may be determined using a simulation program with integrated circuit emphasis (SPICE) model; e.g., by modeling resistance (R), capacitance (C), inductance (L), and/or electromigration properties, or by using other types of modeling and/or other electronic circuit simulators, for example. The modeling may be performed for selected regions of the semiconductor device 100 and/or for critical path areas.

A few alternatives to the design and manufacturing methods described herein will next be described herein. In some of the manufacturing methods herein, the first conductive lines 106 are first patterned first, and the second conductive lines 108 are patterned second. Alternatively, the second conductive lines 108 may be patterned or formed first, and the first conductive lines 106 may be patterned or formed second.

In addition, structures may be formed that are vertically inversed structures of the structures shown in the drawings. For example, particularly in an embodiment wherein the conductive lines 106 and 108 are formed using subtractive etch processes (see FIG. 16), the additional portions of the second conductive lines 108 comprising conductive material 130a may be formed after the conductive material 130b is formed, e.g., in a material layer disposed over the first conductive lines 106 and portions 130b of the second conductive lines 108.

Furthermore, only two lithography masks 112 (FIG. 3) and 122 (FIG. 6), two lithography processes, and two etch processes 114 (FIG. 4) and 124 (FIG. 7) are shown in the drawings; alternatively, three lithography masks, three lithography processes, and three etch processes may be used to form third conductive lines (not shown) having a different height in a vertical direction than the first and second conductive lines 106 and 108 described herein, depending on the number of different resistances needed for conductive lines of the semiconductor device 100. Greater than three lithography masks and lithography processes may also be used, for example.

Rather than using lithography masks and lithography processes, the layers of photoresist 110 (FIG. 3) and 120 (FIG. 7) may optionally be patterned directly using a laser or other direct patterning device or method. The layers of photoresist 110 and 120 may not be required if the insulating material 104 comprises a photosensitive material; e.g., the insulating material 104 may be directly patterned using lithography masks and/or direct patterning methods.

Furthermore, only a few conductive lines 106 and 108 are shown in each of the drawings; however, many conductive lines 106 and 108 may be formed across a surface of the workpiece 102 in accordance with embodiments. Patterns of the conductive lines 106 and 108 may comprise a variety of shapes in a top view; the conductive lines 106 and 108 may not be substantially parallel to one another as shown in the drawings in various regions of the semiconductor devices 100.

Embodiments of the present disclosure include design methods for semiconductor devices 100, and methods of manufacturing the semiconductor devices 100. Embodiments also include semiconductor devices 100 manufactured using the design and manufacturing methods described herein.

Advantages of embodiments of the disclosure include providing novel semiconductor devices 100 and manufacturing and design methods thereof wherein some conductive lines 108 have an increased thickness, but other conductive lines 106 do not. The conductive line 106 and 108 thicknesses are varied and tuned in accordance with resistance and electromigration requirements, which is particularly advantageous for conductive lines having a reduced or scaled-down size, which conductive lines may have poor electromigration properties and high resistance. The methods provide proactive solutions for initial design stages that provide improved conductive line 106 and 108 designs, avoiding a requirement for wire widening later in the manufacturing process to post-fix resistance and electromigration problems. Post-fix wire widening has a drawback in area penalty and is not an option in dense areas, for example. A decrease in resistance, an increase in electromigration guard-band, and an increase in electromigration immunity are provided in selected regions and/or critical path regions where the second conductive lines 108 are formed. The novel conductive line 106 and 108 structures, designs, and manufacturing methods are advantageously easily implementable in design and manufacturing process flows of semiconductor devices 100.

In accordance with one embodiment of the present disclosure, a semiconductor device includes a workpiece and a plurality of first conductive lines disposed over the workpiece in a metallization layer. A plurality of second conductive lines is disposed over the workpiece in the metallization layer. The plurality of second conductive lines comprises a greater vertical height in a cross-sectional view of the workpiece than a vertical height of the plurality of first conductive lines.

In accordance with another embodiment, a semiconductor device includes a workpiece and a plurality of first conductive lines disposed over the workpiece in a metallization layer. The plurality of first conductive lines comprises a first vertical height in a cross-sectional view of the workpiece. A plurality of second conductive lines is disposed over the workpiece in the metallization layer. The plurality of second conductive lines comprises a second vertical height in the cross-sectional view of the workpiece. The second vertical height is greater than the first vertical height.

In accordance with yet another embodiment, a method of manufacturing a semiconductor device includes forming a plurality of first conductive lines over a workpiece in a first metallization layer. The plurality of first conductive lines comprises a first vertical height in a cross-sectional view. The method includes forming a plurality of second conductive lines over the workpiece in the first metallization layer, the plurality of second conductive lines comprising a second vertical height in the cross-sectional view. The second vertical height is greater than the first vertical height.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
    a workpiece;
    a plurality of first conductive lines disposed over the workpiece in a metallization layer;
    a plurality of second conductive lines disposed over the workpiece in the metallization layer, wherein the plurality of second conductive lines comprise a greater vertical height in a cross-sectional view of the workpiece than a vertical height of the plurality of first conductive lines; and
    wherein the plurality of first conductive lines comprise a first horizontal width in the cross-sectional view of the workpiece, wherein the plurality of second conductive lines comprise a second horizontal width in the cross-sectional view of the workpiece, and wherein the second horizontal width is less than the first horizontal width.

2. The semiconductor device according to claim 1, wherein one of the plurality of second conductive lines is disposed between two of the plurality of first conductive lines.

3. The semiconductor device according to claim 1, wherein the second conductive lines are located at edges of the semiconductor device or at edges of a region of the semiconductor device and the first conductive lines are located in central regions between the second conductive lines, or wherein the first conductive lines are located at edges of the semiconductor device or at edges of a region of the semiconductor device and the second conductive lines are located in central regions between the first conductive lines.

4. The semiconductor device according to claim 1, wherein the plurality of second conductive lines comprises power rails.

5. The semiconductor device according to claim 1, wherein the plurality of first conductive lines comprises conductive lines for standard cells.

6. The semiconductor device according to claim 1, wherein the second horizontal width is about one-third to one-half of the first horizontal width.

7. A semiconductor device, comprising:
    a workpiece;
    a plurality of first conductive lines disposed over the workpiece in a metallization layer, the plurality of first conductive lines comprising a first vertical height in a cross-sectional view of the workpiece;
    a plurality of second conductive lines disposed over the workpiece in the metallization layer, the plurality of second conductive lines comprising a second vertical height in the cross-sectional view of the workpiece, wherein the second vertical height is greater than the first vertical height; and
    wherein the metallization layer comprises a first metallization layer, wherein a portion of the plurality of second conductive lines is disposed in a second metallization layer adjacent the first metallization layer, the second metallization layer being vertically above or vertically below the first metallization layer.

8. The semiconductor device according to claim 7, wherein the second vertical height is about 1.5 to 3 times greater than the first vertical height.

9. The semiconductor device according to claim 7, wherein the plurality of second conductive lines comprise a lower resistance than the plurality of first conductive lines.

10. The semiconductor device according to claim 7, wherein the plurality of first conductive lines and the plurality of second conductive lines are disposed within an insulating material.

11. The semiconductor device according to claim 10, wherein the insulating material includes an etch stop layer formed therein, wherein a bottom surface of the plurality of second conductive lines is adjacent a top surface of the etch stop layer.

12. A semiconductor device, comprising:
a substrate;
a dielectric layer on a major surface of the substrate;
a plurality of first conductive lines disposed within the dielectric layer, the plurality of first conductive lines having a first thickness in a direction perpendicular to the major surface;
a plurality of second conductive lines disposed within the dielectric layer and on a same horizontal plane, relative the major surface, as the plurality of first conductive lines, the plurality of second conductive lines having a second thickness in the direction perpendicular to the major surface, the second thickness being greater than the first thickness; and
wherein the plurality of first conductive lines comprise a first horizontal width in a cross-sectional view of the workpiece, wherein the plurality of second conductive lines comprise a second horizontal width in the cross-sectional view of the workpiece, and wherein the second horizontal width is less than the first horizontal width.

13. The semiconductor device according to claim 12, wherein the substrate is selected from the group consisting of silicon, silicon-on-insulator, germanium-on-insulator, and a compound semiconductor.

14. The semiconductor device according to claim 12, wherein one of the plurality of first conductive lines and the plurality of second conductive lines is located at edges of the semiconductor device or at edges of a region of the semiconductor device and the other of the plurality of first conductive lines and plurality of second conductive lines is located in a central region within the edges of the semiconductor device or region.

15. The semiconductor device according to claim 12, wherein the plurality of second conductive lines comprises power rails, and the plurality of first conductive lines comprises conductive lines for standard cells.

16. The semiconductor device according to claim 12, wherein the plurality of first conductive lines comprises a barrier layer and a conductor layer.

17. The semiconductor device according to claim 12, wherein the dielectric layer includes an etch stop layer, and wherein a bottom surface of the plurality of second conductive lines is adjacent a top surface of the etch stop layer.

18. The semiconductor device of claim 1, wherein each one of the plurality of first conductive lines comprises a first area in the cross-sectional view of the workpiece, each one of the second conductive lines has a second area in the cross-section view of the workpiece, and wherein the first area is equal to the second area.

19. The semiconductor device of claim 7, wherein the plurality of first conductive lines comprise a first horizontal width in the cross-sectional view of the workpiece, wherein the plurality of second conductive lines comprise a second horizontal width in the cross-sectional view of the workpiece, and wherein the second horizontal width is less than the first horizontal width.

20. The semiconductor device of claim 12 wherein each one of the plurality of first conductive lines comprises a first area in the cross-sectional view of the workpiece, each one of the second conductive lines has a second area in the cross-section view of the workpiece, and wherein the first area is equal to the second area.

* * * * *